(12) United States Patent
Zou

(10) Patent No.: US 7,342,431 B2
(45) Date of Patent: Mar. 11, 2008

(54) LOW POWER WIDE DYNAMIC RANGE RMS-TO-DC CONVERTER

(75) Inventor: Min Z. Zou, San Jose, CA (US)

(73) Assignee: Linear Technology Corporation, Milpitas, CA (US)

( * ) Notice: Subject to any disclaimer, the term of this patent is extended or adjusted under 35 U.S.C. 154(b) by 25 days.

(21) Appl. No.: 11/493,528

(22) Filed: Jul. 27, 2006

(65) Prior Publication Data

US 2008/0024191 A1 Jan. 31, 2008

(51) Int. Cl.
*G06F 7/44* (2006.01)
(52) U.S. Cl. ...................... 327/349; 327/356
(58) Field of Classification Search ........ 327/346–349, 327/350, 352, 355–357, 100
See application file for complete search history.

(56) References Cited

U.S. PATENT DOCUMENTS

| 6,144,244 | A | 11/2000 | Gilbert | |
| 6,172,549 | B1 * | 1/2001 | Gilbert | 327/349 |
| 6,348,829 | B1 * | 2/2002 | Gilbert | 327/349 |
| 6,429,720 | B1 * | 8/2002 | Gilbert | 327/348 |
| 7,106,604 | B2 * | 9/2006 | Nash | 363/39 |
| 2005/0127986 | A1 | 6/2005 | Gilbert | |

OTHER PUBLICATIONS

Charles Kitchin and Lew Counts, "RMS-DC Conversion-Theory," RMS to DC Conversion Application Guide, 2nd Edition, 1986, pp. 1-6 and Table of Contents, Section 1, Analog Devices, Inc.

* cited by examiner

*Primary Examiner*—Dinh T. Le
(74) *Attorney, Agent, or Firm*—McDermott Will & Emery LLP

(57) ABSTRACT

An RMS to DC converter squares an a-c input signal to obtain a squared direct current voltage signal. The squared direct current voltage signal is applied to successive stages, each stage amplifying its received signal and detecting the amplified level of the signal within a confined range. The detected levels detected in the successive stages are added to produce an output d-c signal that is variable in linear proportion to logarithmic change in RMS voltage of the input signal. The voltage level of the squared direct current voltage signal can be clamped to a predetermined maximum voltage. To expand the range of detection, the squared direct current voltage signal is attenuated prior to detection in one or more of the stages.

18 Claims, 5 Drawing Sheets

LOW POWER WIDE DYNAMIC RANGE RMS-TO-DC CONVERTER

TECHNICAL FIELD

This disclosure relates to RMS-to-DC converters, more particularly to converters that produce a voltage that is variable in linear proportion to logarithmic change in RMS voltage of an a-c voltage signal.

BACKGROUND

Measurement of high frequency signal strength is often required in wireless communication systems. In order to obtain meaningful detection capability for a wide dynamic range in such systems, a linear relationship between output DC voltage/current and input signal power in dBm is desirable. Measurement of output should be insensitive to the input waveform even with a high crest factor, i.e., peak amplitude divided by RMS value.

Optimal operation is dependent upon several factors. Precision measurement of input signal regardless of its waveform over a wide dynamic range of the input signal power is a most important consideration. Fast envelope detection of a modulated input signal is advantageous in obtaining an output that is independent of the input signal waveforms. Linear input impedance vs input power is needed to avoid distortion back to the signal source. As systems often may be subject to considerable temperature variations, stable output should be maintained across the temperature range. Low dc power consumption, of course, is an important objective.

A conventional RMS-to-DC voltage converter is shown in the block diagram of FIG. 1. An a-c signal $V_{IN}$ is applied to X and Y inputs to square cell 20. The square cell output is applied to capacitor 22, which serves to average the voltage applied thereto. Operational amplifier 24 receives the voltage at capacitor 22 and provides the output voltage $V_{OUT}$. In the absence of a feedback signal to the Z input, the output of the square cell would be a function of the square of the input signal. To obtain an rms value directly corresponding to $V_{IN}$ in such arrangement, output stages would be necessary to perform a square root functionality. As the squared voltages applied to these stages would vary over wide expanded dynamic range of amplitude, the converter would be severely limited to input signals of limited dynamic range. Thus, to expand the dynamic range of the input, the output voltage $V_{OUT}$ is fed back to the Z input of the square cell, which divides the product of the signals applied to the X and Y inputs by the output voltage to perform the square root function prior to averaging. Divided by the average of the output level, the average signal now varies linearly with the rms level of the input, as represented in FIG. 2.

High frequency operation requires the square cell to be biased at reasonable dc quiescent current for all active transistors. The scaling of the biasing current (through Z factor) will significantly degrade the high frequency performance of the square cell (or multiplier XY). However, the magnitude of the dc output signal after the square cell is increased exponentially. For example, an input signal from 10 mV to 1V may be contracted and expanded to 1 mV to 10V at the output of the square cell. In other words, an input signal of 40 dB range is converted to an output signal with 80 dB range. The supply voltage will limit the peak input signal that a square cell can handle due to the headroom of the square cell, as well as subsequent output signal processing. As a result, the converter will have a very limited handling capability for a large input signal. DC offset, caused by device mismatches, will limit the minimum detectable level of the output voltage that can be resolved.

FIG. 3 is a block diagram of a known variation of the converter of FIG. 1 wherein current outputs of balanced square cells 21 and 23 are summed by summing circuit 26. $V_{IN}$ is applied to the input of cell 21. The output of summing circuit 26 is averaged by capacitor 22 and amplified by amplifier 24 to produce the output voltage $V_{OUT}$, which is applied to the input of cell 23. Summing circuit 26 produces a signal that is the difference between the currents of the square cells.

In summary, the converters of FIGS. 1 and 3 have the following disadvantages. Due to the scaling factor Z applied to the square cell, operation is limited to low frequencies. Due to the closed feedback loop wherein the large $C_{ave}$ of the averaging loop filter sets the loop bandwidth, a slow output response to the input signal change is obtained. Moreover, as the output linearly corresponds to the input, the dynamic range of the converter is limited in comparison with an output that is variable in linear proportion to logarithmic change in RMS voltage of an a-c voltage signal.

Disclosure

The present disclosure overcomes the above-described deficiencies of the prior art. An RMS power to DC converter includes a square cell coupled to an a-c voltage input. A detection circuit is coupled between an output of the square cell and a voltage output node of the converter. The detection circuit includes a plurality of detector cells, each having an output coupled in common with the voltage output node. A plurality of gain cells have outputs that are coupled to inputs of respective ones of the detector cells. The plurality of detector cells may all have substantially the same range of input voltage detection and the gain cells may all have substantially the same gain. The gain cells are coupled in series. At least one of the gain cells is coupled in series between another gain cell and an input of one of the detector cells. The output node of the converter provides a level corresponding to the sum of the outputs of the successive detector stages, the level varying linearly with dB changes in the RMS value of the voltage input.

An attenuation circuit may be coupled between the output of the square cell and a reference potential. An input of a first one of the gain cells is coupled to the output of the square cell. An input of a first one of the detector cells is coupled to an attenuation node of the attenuation circuit. An attenuation stage can thus be cascaded to extend the detection range of the converter for larger input signals. The attenuation circuit may include a plurality of impedances arranged in series, the attenuation node formed as a first attenuation node between a first and second one of the impedances, and a second attenuation node formed between the second one of the impedances and a third one of the impedances. Detector cells are coupled at their inputs to respective attenuation nodes. The first impedance is coupled between the square cell output and the first attenuation node, and may be coupled in parallel with a voltage clamping circuit. A second clamping circuit may be coupled across the second impedance.

In operation, the converter squares the a-c signal to obtain a squared direct current voltage signal. The squared direct current voltage signal is applied to successive stages, each stage amplifying its received signal and detecting the amplified level of the signal within a confined range. The detected levels detected in the successive stages are added to produce an output d-c signal that is variable in linear proportion to logarithmic change in RMS voltage of the input signal. The voltage level of the squared direct current voltage signal can be clamped to a predetermined maximum voltage. To expand the range of detection, the squared direct current voltage signal is attenuated prior to detection in one or more of the stages.

Additional advantages of the disclosed invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

The present invention is illustrated by way of example, and not by way of limitation, in the figures of the accompanying drawing and in which like reference numerals refer to similar elements and in which.

DETAILED DESCRIPTION

Figure 1:
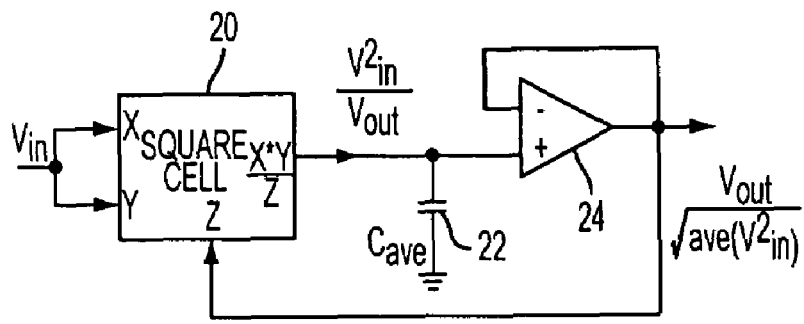
FIG. 1 is a block diagram of a conventional RMS-to-DC voltage converter.
Figure 2:
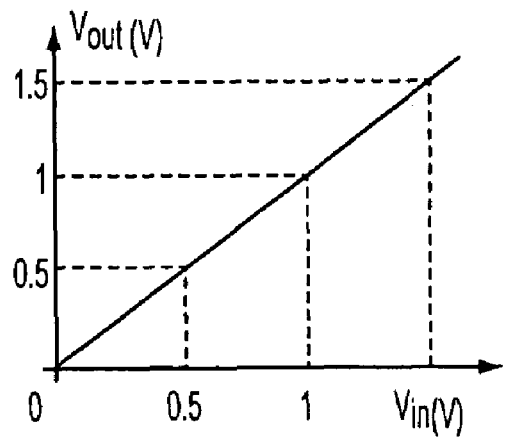
FIG. 2 is a chart graphically representing the voltage output versus input of the converter of FIG. 1.
Figure 3:
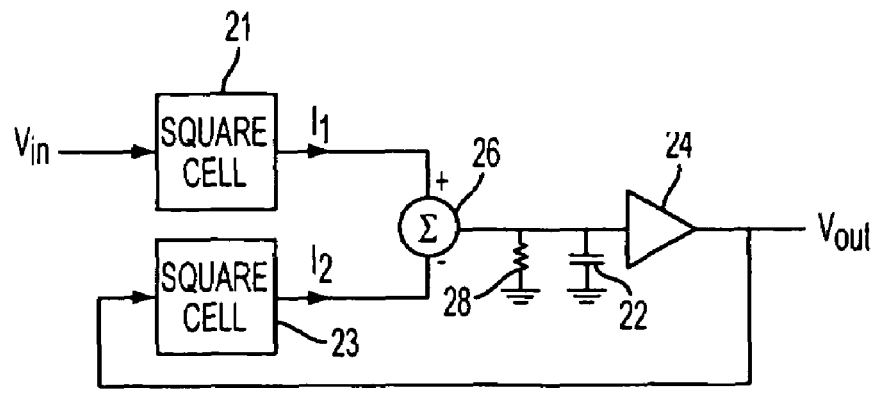
FIG. 3 is a block diagram of a known variation of the converter of FIG. 1.
Figure 4:
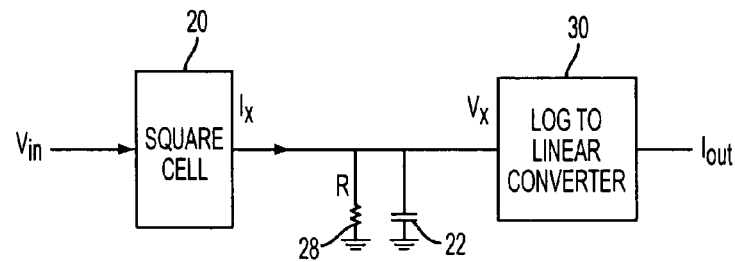
FIG. 4 is a block diagram of power detector in accordance with the disclosed invention.

FIG. 4 is a block diagram of a linear-in-dB open loop power detector in accordance with the disclosed invention. An ac signal $V_{IN}$ is input to square cell 20. The square cell generates a current output $I_x$ corresponding to the input signal. This output is applied to a voltage averaging circuit schematically shown as the parallel coupled capacitor 22 and resistor 28. With this averaging filter, the voltage Vx is essentially a DC component regardless of input signal. The voltage $V_x$ is applied to Log-to-Linear Converter 30.

Figure 5:
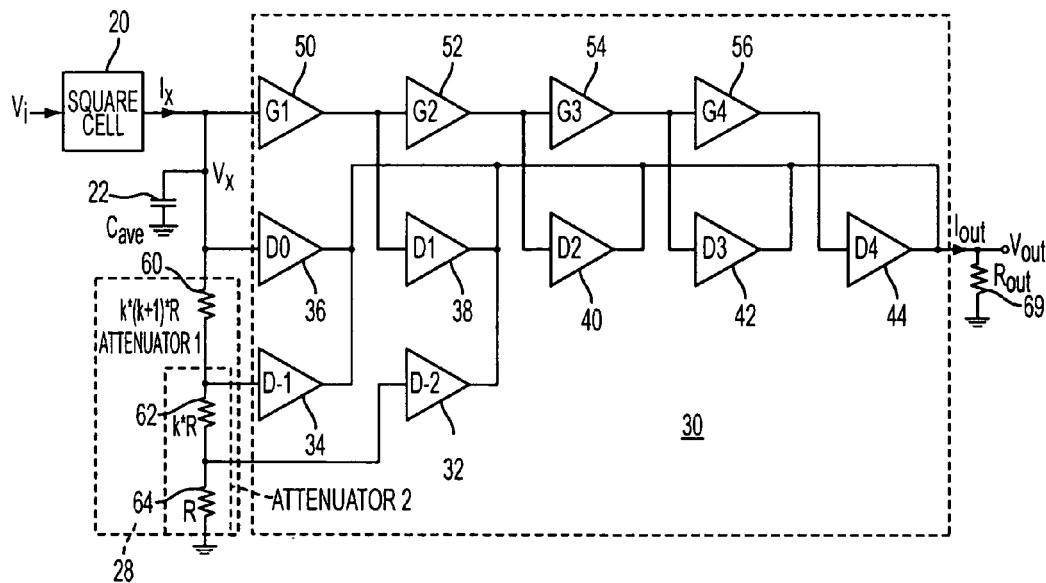
FIG. 5 is a more detailed block diagram of the arrangement of FIG. 4.

FIG. 5 is a more detailed block diagram of the arrangement of FIG. 4. Outputs of cascaded detectors 34 to 44 are coupled in common to the $V_{OUT}$ output node. Gain stages 50 to 56 are coupled in series between square cell 20 and the input of detector 44. The individual gain stages and detectors may be configured in accordance with known amplifier and detector circuits. Resistive attenuation circuit 28, comprising resistors 60, 62 and 64 connected in series, is coupled between the output of square cell 20 and ground. The input of detector 32 is coupled to an attenuation node between resistors 62 and 64. The input of detector 34 is coupled to an attenuation node between resistors 60 and 62. The input of detector 36 is coupled to the output of square cell 20. The output of gain stage 50 is coupled to the input of detector 38. The output of gain stage 52 is coupled to the input of detector 40. The output of gain stage 54 is coupled to the input of detector 42. The output of gain stage 56 is coupled to the input of detector 44. Currents produced by all detectors are summed to produce an output current $I_{OUT}$. This current, applied to output resistor 69, produces the output voltage $V_{OUT}$.

The DC offset at Vx can be calibrated by measuring the output voltage of amplifier 56 before the input signal $V_{IN}$ is applied. Detector 44 may be designed for polarity detection of the DC offset at $V_x$ for DC offset trimming.

In operation, each gain stage and its detector are responsible for measuring a certain range of the input signal. Each stage may have the same gain. Each detector has a limited detecting range, for example, about 9.5 dB from 30 mV to 100 mV. In this example, when its input voltage is lower than 30 mV, the detector will not contribute to the output current $I_{OUT}$. Between voltages of 30 mV to 100 mV applied to its input, the detector will produce an output current that changes proportionately with changes of the input voltage. At voltages higher than 100 mV, the detector will no longer increase its contribution to the output current.

As the input signal $V_{IN}$ increases in strength from zero, detector 44 will be the first detector to produce a signal, as it has received an input applied with the greatest gain. That is, the last gain stage 56 amplifies the input signal, already amplified by gain stages 50 to 54, to a level sufficient for detector 44 to start detection. At this time, the signals at the output of gain stages 50 to 54 are not large enough for generating detection outputs from detectors 38 to 42. The inputs to detectors 32, 34 and 36 at this time, which either directly receive the output level of square cell 20 or an attenuated portion thereof, are also insufficient to affect detection. Thus; the minimum input signal is only detected by 44.

Figure 6:
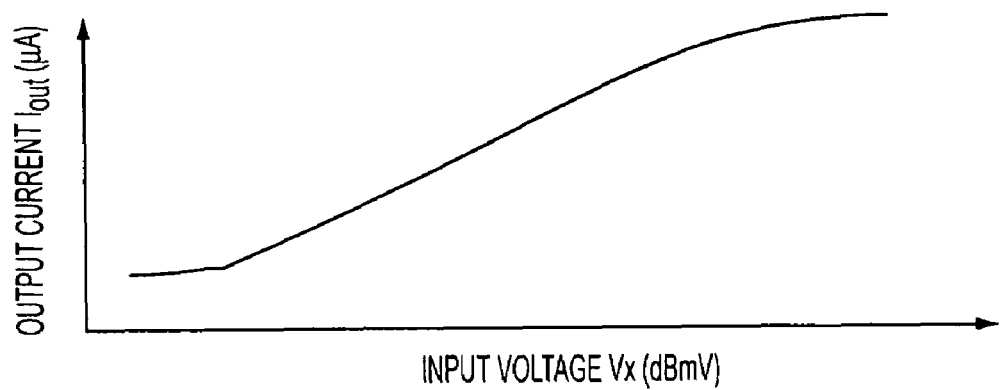
FIG. 6 is a chart graphically representing total output current versus input voltage in dB for the converter of FIG. 5.

As the input signal increases, a point will be reached at which the output signal at gain stage 56 will be limited to a constant output level and the output of detector 44 limited as well. The output signals of gain stages 50 to 54 also will have increased enough for detector 42 to start to generate significant output current. The output currents of detector 42 and 44 are then summed at the output node. As the input signal increases further, the signals applied to the remaining detectors by their respect gain stages increase until all detectors will have reached their limited outputs and a maximum output is reached. Thus, the maximum input signal is detected by all detectors 32 to 44. By successively detection of these detectors and summing their outputs, logarithmic conversion is realized. The total output current is linear versus input voltage in dB within a wide range of input power as shown in FIG. 6.

Figure 7:
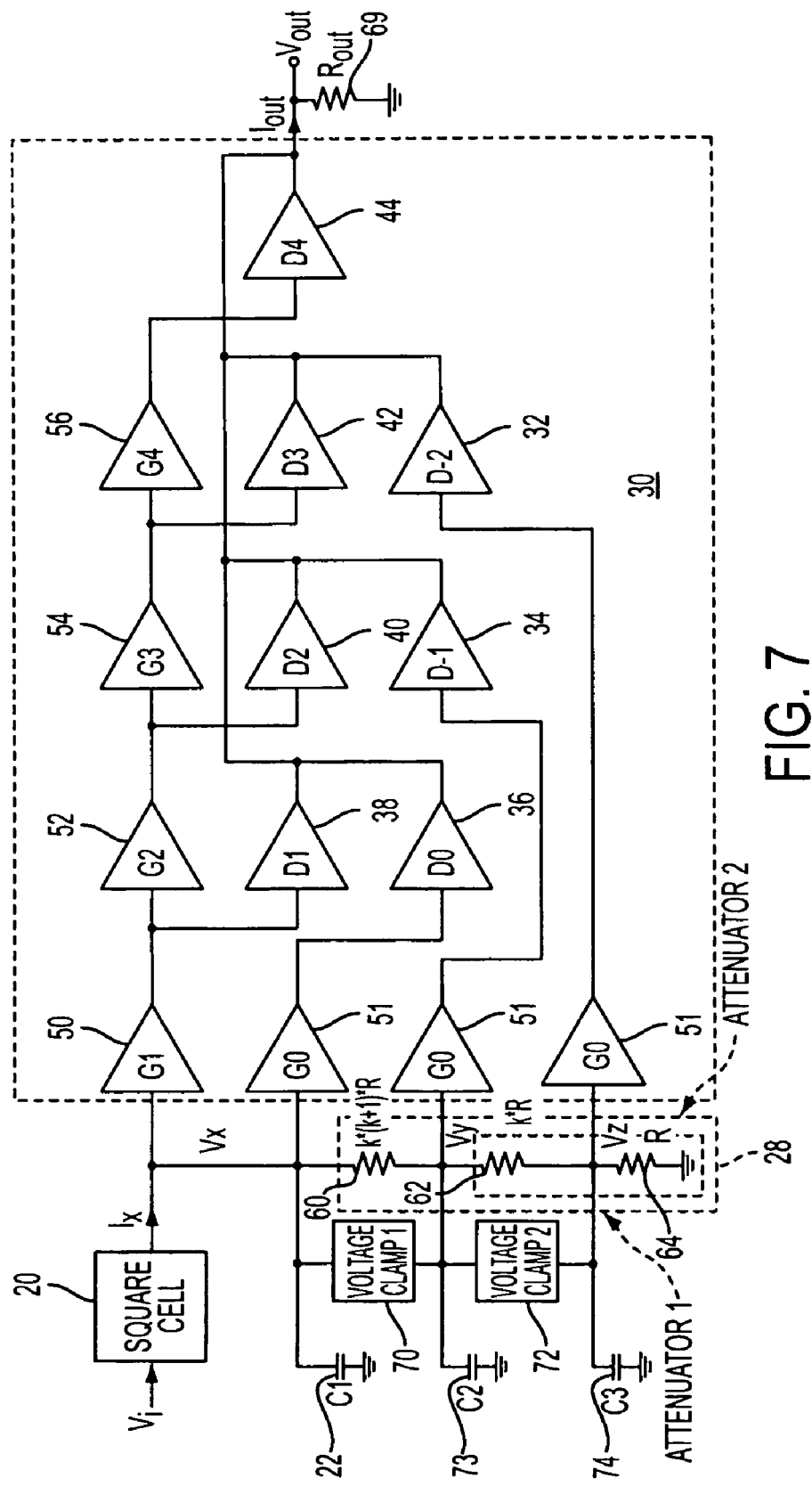
FIG. 7 is a block diagram of a variation of the arrangement of FIG. 5.

FIG. 7 is a block diagram of a variation of the arrangement of FIG. 5. Voltage clamp 70 is coupled in parallel with resistor 60. Capacitor 22 is coupled from the output of the square cell to ground. Voltage clamp 72 is coupled in parallel with resistor 62. Capacitor 73 is coupled to ground. Capacitor 74 is coupled in parallel with resistor 64. Unity-gain buffer amplifiers 51 are coupled respectively between a node of attenuation circuit 28 and the inputs of one of the detectors 32 to 36.

Voltage clamps 70 and 72 in their simplest form may each comprise a diode. The voltage clamps compress the voltage $V_x$ without compressing the output current and without affecting the detection accuracy for those detectors having an input voltage higher than the maximum detection range (100 mV in the above example). Current in voltage clamp 70 and resistor 60 of the first attenuation stage are combined and applied to the next attenuator stage, comprising resistor 62 and voltage clamp 72.

Capacitors 22, 73 and 74 in concert with the loading resistors 60, 62 and 64 form a rippling filter to remove the high frequency carrier. This function differs from the averaging function for a modulated signal at much lower frequency. Therefore, the capacitance of capacitors 60, 62 and 64 can be much lower. Capacitors 60, 62 and 64 can be proportionally scaled up to form constant RC filter to remove the high frequency ripple and provide for accurate detection at the Vout node for a high speed modulated signal. Buffer amplifiers 51 prevent the high frequency squared signals from coupling to the detectors. Corruption of detector accuracy by generation of parasitic dc output is thereby avoided.

As a detector no longer increases its output current when the input voltage exceeds its maximum, the voltage input to detector 34 is clamped to, in the example, 100 mV, and thus a very small signal is passed to the previous stages without affecting the detection accuracy. By properly limiting the input voltages to 100 mV for the detectors that already generate maximum output and recombining all currents into the inputs of the attenuators, the maximum voltage $V_x$ can be compressed while the detecting accuracy remains unchanged. The voltage headroom is thus saved for handling a higher input signal. Thus the dynamic arrange of RMS-to-DC converter can be improved.

Operation is more fully explained with respect to the following implementation example. Voltage clamps 70 and 72 each may be configured simply as a diode. The input impedance of gain stages 50 and 51 is substantially higher than the load resistance $(k+1)^2*R$, which is the sum of the resistances of resistors 60, 62 and 64, at Vx. The DC output current Ix will flow to resistors 60, 62 and 64 when the current Ix is small. When Ix increases, the output DC signal after amplification of gain stages 50 to 56 is large enough that detector 44 starts to generate detection output current. The output signals at the remaining gain stages/attenuation stages are still small enough that detectors 32 to 42 do not generate detection output current. As current Ix increases, the other detectors begin detection.

Once the output DC voltage at Vx is greater than a certain level (e.g. >150 mV), higher voltage will not make detectors 36 to 44 generate more output detection current. Therefore, the voltage at Vx can be ideally limited to 150 mV. However, for the other attenuation stages, all input DC current Ix has to pass to the resistors 62 and 64 such that the voltage at the nodes Vy remain unaffected by the clamping circuit 70. With a diode implemented for the voltage clamp 70, the forward diode starts to turn on and clamp the voltage across resistor 60 to 0.7V (Vx–Vy). Since a detector only detect an input voltage less than 150 mV, the clamp diode will have no impact on the detection accuracy of detector cells 36 to 44. The DC component of the output current of Ix will split into resistor 60 and voltage clamp 70 and recombine to flow to resistor 62. The detectors 32 and 34 will start to detect the increase of input current Ix. As Ix increases further, the voltage across resistor 62 becomes high enough to turn on the diode in voltage clamp 72. The voltage is again clamped to 0.7V (Vy–Vz).

Figure 8:
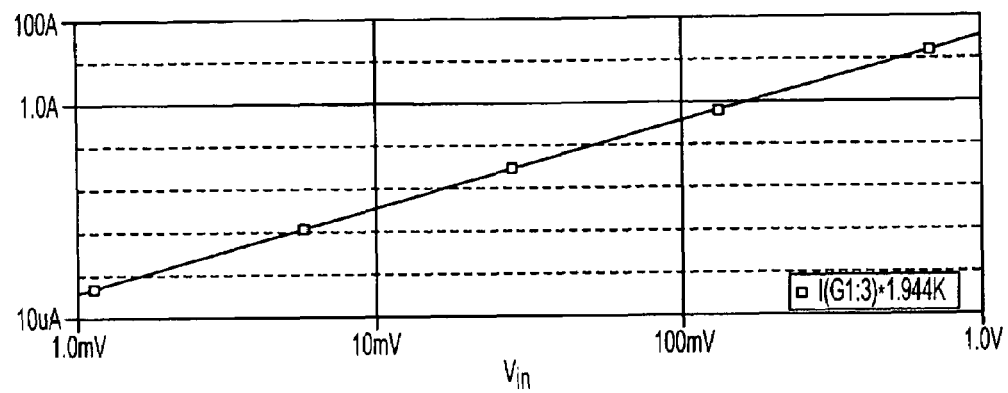
FIG. 8 is a chart representing square cell output voltage versus input voltage for the converter of FIG. 5.
Figure 9:
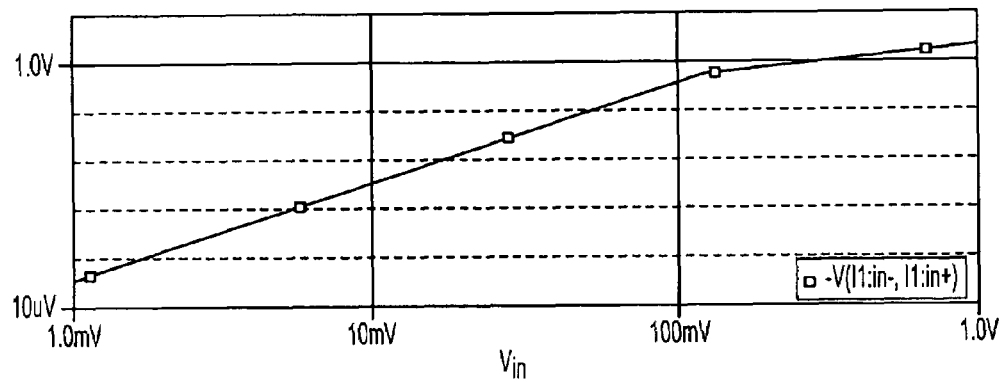
FIG. 9 is a chart representing square cell output voltage versus input voltage for the converter of FIG. 5.
Figure 10:
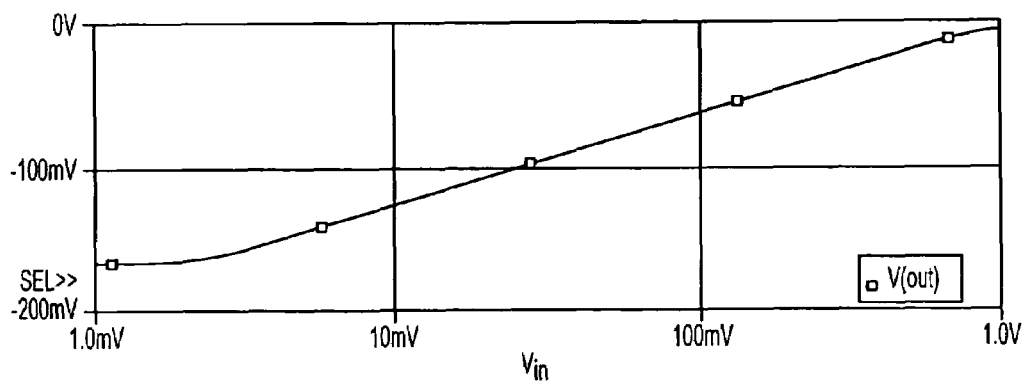
FIG. 10 is a chart representing output voltage versus input voltage on a log scale for the present invention.

FIGS. 8-10 are charts that graphically illustrate this exemplified implementation. FIG. 8 represents the DC output current from the square cell 20, multiplied by the load resistance, for a voltage input range of 1 mv to 1V. FIG. 9 represents the DC voltage $V_x$ at the output of the square cell 20 with the voltage clamps 70 and 72 in circuit for the same input voltage range. FIG 10 represents the output voltage versus the input voltage in log-scale.

To detect a 1V input signal, in this case, the voltage at node Vx could be, for example, 37.4V, which is the output current Ix multiplied by the load resistor $(k+1)^2*R$. The $V_x$ versus input voltage characteristic is shown in FIG. 8. With the diode clamps, as shown in FIG. 9, the characteristic changes as the clamping circuits each become active. Vx reaches a maximum of 2.25V. Vx is proportional to Ix for the input voltage Vin up to 500 mV, then it is clamped to 0.7V by the diode voltage clamp. As shown in FIG. 10, log-to-linear voltage conversion performs well without sacrificing the detection accuracy under a power supply voltage that may be limited to 3V.

In this disclosure there are shown and described only preferred embodiments of the invention and but a few examples of its versatility. It is to be understood that the invention is capable of use in various other combinations and environments and is capable of changes or modifications within the scope of the inventive concept as expressed herein. For example, the gains and detection ranges in the various stages may be adjusted as desired for desired characteristics. Design changes also may be made in the number and type of attenuation elements and clamping circuits.

What is claimed is:

1. A method for converting an input a-c signal to an output d-c signal comprising the steps of:
    squaring the a-c signal to obtain a squared direct current voltage signal;
    applying the squared direct current voltage signal to successive stages, wherein, at each stage, the step of applying further comprises the steps of amplifying a signal received at that stage and detecting an amplified level of a signal produced by that stage in the amplifying step;
    adding signal levels detected in the successive stages to produce an output d-c signal that is variable in linear proportion to logarithmic change in RMS voltage of the input signal.

2. A method as recited in claim 1, wherein the detecting step in each stage is confined to a specified range of input signal to that stage.

3. A method as recited in claim 2, wherein the specified range is the same for each stage.

4. A method as recited in claim 2, further comprising the step of clamping voltage level of the squared direct current voltage signal to a predetermined voltage.

5. A method as recited in claim 2, wherein the step of applying further comprises attenuating the squared direct current voltage signal prior to detection in one of the stages.

6. A method as recited in claim 2, wherein the detecting step in each stage is confined to the same specified level range.

7. A method as recited in claim 6, wherein the level of signal amplification per stage increases in each successive stage.

8. An RMS to DC converter comprising:
    a square cell coupled to an a-c voltage input node;
    a detection circuit coupled between an output of the square cell and a voltage output node of the converter, the detection circuit comprising a plurality of detector cells having respective outputs coupled in common with the voltage output node, and a plurality of gain cells having respective outputs coupled to respective inputs of the detector cells; and an attenuation circuit coupled between the output of the square cell and a reference potential; wherein an input of a first one of the gain cells is coupled to the output of the square cell and an input of a first one of the detector cells is coupled to an attenuation node of the attenuation circuit;

whereby the voltage at the voltage output node is variable in linear proportion to logarithmic change in RMS voltage at the a-c voltage input node.

9. An RMS to DC converter as recited in claim 8, wherein a second one of the gain cells is coupled between the attenuation node and the input of the first one of the detector cells.

10. An RMS to DC converter as recited in claim 9, wherein the attenuation circuit comprises:

a plurality of impedances arranged in series, the attenuation node formed as a first attenuation node between a first and second one of the impedances, and a second attenuation node formed between the second one of the impedances and a third one of the impedances; and wherein an input of a second one of the detector cells is coupled to the second attenuation node.

11. An RMS to DC converter as recited in claim 10, wherein a third one of the gain cells is coupled between the second attenuation node and the input of the second one of the detector cells.

12. An RMS to DC converter as recited in claim 10, wherein at least one of said plurality of gain cells is coupled in series between the first one of the gain cells and an input of a third one of the detector cells.

13. An RMS to DC converter as recited in claim 8, wherein the first one of the gain cells is directly connected to the output of the square cell.

14. An RMS to DC converter as recited in claim 8, wherein the plurality of detector cells each have substantially the same range of input voltage detection.

15. An RMS to DC converter as recited in claim 8, wherein the plurality of gain cells each have substantially the same gain.

16. An RMS to DC converter as recited in claim 10, wherein the first impedance is coupled between the square cell output and the first attenuation node, and further comprising a voltage clamping circuit coupled across the first impedance.

17. An RMS to DC converter as recited in claim 16, further comprising a second clamping circuit coupled across the second impedance.

18. An RMS to DC converter as recited in claim 8, wherein the plurality of gain cells are coupled in series with each other.

* * * * *